(12) United States Patent
Wang et al.

(10) Patent No.: US 11,084,127 B2
(45) Date of Patent: Aug. 10, 2021

(54) LASER LIFT OFF METHOD AND LASER LIFT OFF SYSTEM

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ting Wang, Beijing (CN); Zhiliang Jiang, Beijing (CN); Zhenli Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 188 days.

(21) Appl. No.: 16/336,885

(22) PCT Filed: Feb. 12, 2018

(86) PCT No.: PCT/CN2018/076401
§ 371 (c)(1),
(2) Date: Mar. 26, 2019

(87) PCT Pub. No.: WO2019/019615
PCT Pub. Date: Jan. 31, 2019

(65) Prior Publication Data
US 2019/0247958 A1    Aug. 15, 2019

(30) Foreign Application Priority Data

Jul. 27, 2017 (CN) .......................... 201710625191.4

(51) Int. Cl.
*H01L 51/00* (2006.01)
*H01L 51/56* (2006.01)
(Continued)

(52) U.S. Cl.
CPC ............ *B23K 26/36* (2013.01); *B23K 26/142* (2015.10); *H01L 51/003* (2013.01);
(Continued)

(58) Field of Classification Search
CPC ...... B23K 26/36; B23K 26/142; B23K 26/27; B23K 26/57; Y02E 10/549; H01L 51/56;
(Continued)

(56) References Cited

U.S. PATENT DOCUMENTS 5,376,225 A    12/1994    Wakabayashi et al.
6,924,456 B2   8/2005     Brask
(Continued)

FOREIGN PATENT DOCUMENTS

CN    1579697 A       2/2005
CN    103117212 A     5/2013
(Continued)

OTHER PUBLICATIONS

First Office Action issued in corresponding Chinese Patent Application No. 201710625191.4, dated Sep. 30, 2018, with English translation.
(Continued)

*Primary Examiner* — Caridad Everhart
(74) *Attorney, Agent, or Firm* — McDermott Will and Emery LLP

(57) ABSTRACT

A laser lift-off method is disclosed. The laser lift-off method includes: controlling a laser beam to penetrate a substrate along a first irradiation direction, so as to scan an interface between a material layer and the substrate stacked on each other, wherein there is at least one particle on a side of the substrate away from the material layer, and a region of the interface not irradiated by the laser beam along the first irradiation direction is an occluded region; controlling another laser beam to penetrate the substrate along a second
(Continued)

irradiation direction, so as to scan the interface between the material layer and the substrate, so that at least a part of the occluded region is irradiated by the another laser beam along the second irradiation direction; and separating the material layer from the substrate.

17 Claims, 4 Drawing Sheets

(51) Int. Cl.
 *B23K 26/36* (2014.01)
 *B23K 26/57* (2014.01)
 *B23K 26/142* (2014.01)
(52) U.S. Cl.
 CPC .......... *H01L 51/0097* (2013.01); *H01L 51/56* (2013.01); *H01L 2227/326* (2013.01)
(58) Field of Classification Search
 CPC ............... H01L 51/0097; H01L 51/003; H01L 51/0016; H01L 2227/326
 See application file for complete search history.

(56) References Cited

U.S. PATENT DOCUMENTS

| | | | |
|---|---|---|---|
| 2006/0113286 A1 | 6/2006 | Furui | |
| 2007/0298587 A1* | 12/2007 | Park | B23K 26/0838 438/458 |
| 2017/0221929 A1 | 8/2017 | Yu | |
| 2018/0108874 A1* | 4/2018 | Tanaka | B23K 26/064 |
| 2019/0247958 A1 | 8/2019 | Wang et al. | |
| 2020/0135965 A1* | 4/2020 | Albert | H01L 21/67103 |

FOREIGN PATENT DOCUMENTS

| | | |
|---|---|---|
| CN | 105679772 A | 6/2016 |
| CN | 105935838 A | 9/2016 |
| CN | 106141451 A | 11/2016 |
| CN | 206153761 U | 5/2017 |
| CN | 107414289 A | 12/2017 |
| DE | 2108144 B2 | 2/1980 |
| DE | 102005010087 B3 | 8/2006 |
| GB | 1342834 A | 1/1974 |
| JP | H6-277863 A | 10/1994 |
| JP | 2004-170515 A | 6/2004 |
| JP | 2007-118009 A | 5/2007 |
| JP | 5142144 B2 | 2/2013 |
| JP | 2015-194642 A | 11/2015 |
| WO | 2016143316 A1 | 9/2016 |

OTHER PUBLICATIONS

International Search Report and Written Opinion issued in corresponding International Application No. PCT/CN2018/076401, dated May 16, 2018, with English translation.

* cited by examiner

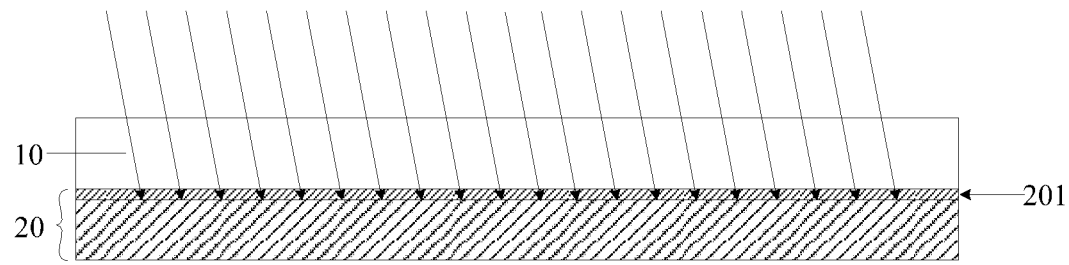

FIG. 1(a)

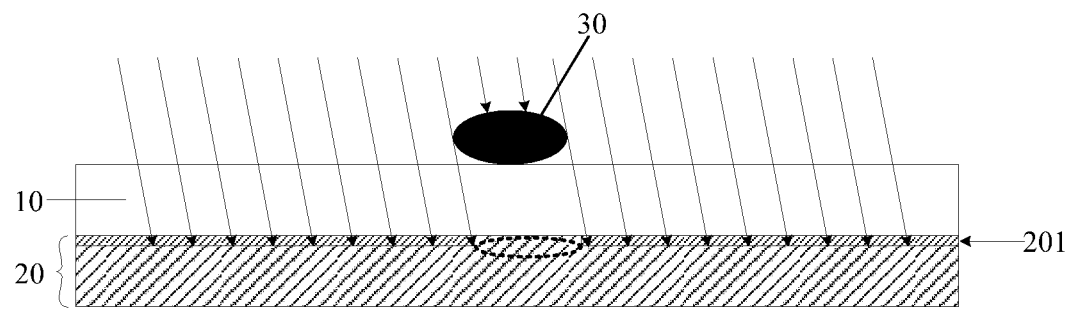

FIG. 1(b)

```
Controlling a laser beam to penetrate a substrate along a first irradiation direction,
so as to scan an interface between the material layer and the substrate, wherein      ─ S100
there Is a particle on a side of the substrate away from the material layer, and a
region of the interface not irradiated by the laser beam along the first irradiation
                        direction is a occluded region
```

```
Controlling another laser beam to penetrate the substrate along a second
irradiation direction, so as to scan the interface between the material layer and the   ─ S101
substrate, so that at least a part of the shaded region is irradiated by the another
                laser beam along the second irradiation direction
```

```
                                                                                        ─ S102
              Separating the material layer from the substrate.
```

FIG. 2

LASER LIFT OFF METHOD AND LASER LIFT OFF SYSTEM

CROSS-REFERENCE TO RELATED APPLICATION

This application is a U.S. National Phase under 35 U.S.C. § 371 of International Patent Application No. PCT/CN2018/076401, filed on Feb. 12, 2018, which in turn claims the benefit of Chinese Patent Application No. 201710625191.4, filed on Jul. 27, 2017, titled "A LASER LIFT-OFF METHOD AND LASER LIFT-OFF SYSTEM", the entire disclosures of which Applications are incorporated by reference herein.

TECHNICAL FIELD

The present disclosure relates to the field of laser lift-off technologies, and in particular to a laser lift-off method and a laser lift-off system.

BACKGROUND

A laser lift-off technique is used widely at present owing to its easy operation, high practicability, and capability in effective separation of an organic material layer from a substrate without damaging the substrate. For example, the laser lift-off technique is applied to many fields such as organic light-emitting diode production, flexible display, and thin wafer lift-off.

SUMMARY

The following technical solution is adopted in embodiments of the present disclosure:

On the one hand, a laser lift-off method is provided, including: controlling a laser beam to penetrate a substrate along a first irradiation direction, so as to scan an interface between a material layer and the substrate stacked on each other, wherein there is at least one particle on a side of the substrate away from the material layer, and a region of the interface not irradiated by the laser beam along the first irradiation direction is an occluded region; controlling another laser beam to penetrate the substrate along a second irradiation direction, so as to scan the interface between the material layer and the substrate, so that at least a part of the occluded region is irradiated by the another laser beam along the second irradiation direction; and separating the material layer from the substrate.

Optionally, before controlling the another laser beam to penetrate the substrate along the second irradiation direction, so as to scan the interface between the material layer and the substrate, the method further includes: detecting a size of the at least one particle, and determining the second irradiation direction according to the detected size of the at least one particle and the first irradiation direction.

Optionally, the first irradiation direction is a direction along which an angle between the laser beam and the substrate is $\theta_1$, the second irradiation direction is a direction along which an angle between the another laser beam and the substrate is $\theta_2$, and the first irradiation direction and the second irradiation direction are on a same side of a plane perpendicular to the substrate; $\theta_2$ is:

$$\theta_2 = \arctan\left(\frac{H\cdot\tan\theta_1}{H + L\cdot\tan\theta_1}\right),$$

where L is a biggest size of the at least one particle, and H is a thickness of the substrate.

Optionally, the first irradiation direction is a direction along which an angle between the laser beam and the substrate is $\theta_1$, the second irradiation direction is a direction along which an angle between the another laser beam and the substrate is $\theta_2$, and the first irradiation direction and the second irradiation direction are on different sides of a plane perpendicular to the substrate; $\theta_2$ is:

$$\theta_2 = \arctan\left(\frac{H\cdot\tan\theta_1}{L\cdot\tan\theta_1 - H}\right),$$

where, L is a biggest size of the at least one particle, and H is a thickness of the substrate.

Optionally, before separating the material layer from the substrate, the method further includes: controlling a yet another laser beam to penetrate the substrate along a third irradiation direction, so as to scan the interface between the material layer and the substrate, so that a region of the interface not irradiated by the laser beam along the first irradiation direction and the another laser beam along the second irradiation direction is irradiated by the yet another laser beam along the third irradiation direction.

Further optionally, the first irradiation direction is a direction along which an angle between the laser beam and the substrate is $\theta_1$, the second irradiation direction is a direction along which an angle between the another laser beam and the substrate is $\theta_2$, the third irradiation direction is a direction along which an angle between the yet another laser beam and the substrate is $\theta_3$, the first radiation direction and the second radiation direction are on a same side of a plane perpendicular to the substrate, and the first irradiation direction and the third irradiation direction are on different sides of the plane perpendicular to the substrate;

$\theta_2$ is:

$$\theta_2 = \arctan\left(\frac{H\cdot\tan\theta_1}{H + X\cdot\tan\theta_1}\right);$$

$\theta_3$ is:

$$\theta_3 = \arctan\left(\frac{H\cdot\tan\theta_1}{(L-X)\cdot\tan\theta_1 - H}\right),$$

where 0<X<L, L is a biggest size of the at least one particle, and H is a thickness of the substrate.

Optionally, detecting a size of the at least one particle and determining the second irradiation direction according to the detected size of the at least one particle and the first irradiation direction includes: in response to detecting multiple particles on a side of the substrate away from the material layer, determining a size of a biggest particle in the multiple particles according to sizes of the multiple particles; and determining the second irradiation direction according to the size of the biggest particle and the first irradiation direction.

Optionally, before controlling the another laser beam to penetrate the substrate along the second irradiation direction, so as to scan the interface between the material layer and the substrate, the method further includes: detecting a location of the at least one particle on the substrate, and determining a location of the occluded region according to the detected location of the at least one particle on the substrate and the first irradiation direction; controlling the another laser beam to penetrate the substrate along the second irradiation direction, so as to scan the interface between the material layer and the substrate, includes: controlling the another laser beam to penetrate the substrate along the second irradiation direction to scan the occluded region.

On the other hand, a laser lift-off system is provided, including: a laser source configured to emit laser beams; and a control device connected with the laser source and configured to control one of the laser beams emitted by the laser source to penetrate a substrate along a first irradiation direction, so as to scan an interface between a material layer and the substrate stacked on each other. There is at least one particle on a side of the substrate away from the material layer, and a region of the interface not irradiated by the one of the laser beams along the first irradiation direction is an occluded region. The control device is further configured to control another one of the laser beams emitted by the laser source to penetrate the substrate along a second irradiation direction, so as to scan the interface between the material layer and the substrate, so that at least a part of the occluded region is irradiated by the another one of the laser beams along the second irradiation direction.

Optionally, the laser lift-off system further includes a detection device configured to detect a location and/or a size of the at least one particle.

Further optionally, the detection device is an automatic optic inspection device.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to these drawings without paying any creative effort.

FIG. 1(a) is a schematic diagram of working principle of laser lift-off;

FIG. 1(b) is a schematic diagram illustrating how a particle affects laser lift-off;

FIG. 2 is a schematic flow chart of a laser lift-off method according to embodiments of the present disclosure;

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Exemplarily, in a manufacturing process of a flexible display panel, as shown in FIG. 1(a), when a laser is used for separating a flexible substrate 20 (for example, a material of the flexible substrate 20 may be polyimide (abbreviated as PI)) from a hard substrate 10, the laser penetrates the hard substrate 10 and is absorbed by an organic material in a laser action region 201 of the flexible substrate 20, and a structure of the organic material in the laser action region 201 is destroyed under an action of the laser, thereby the flexible substrate 20 is separated from the hard substrate 10.

However, particles with a diameter of less than 10 μm are difficult to remove thoroughly in a pre-cleaning stage of a laser lift-off technique, and the laser is easy to be affected by the particles in the laser lift-off technique. The particles will prevent the organic material from absorbing the laser. As shown in FIG. 1(b), existence of a particle 30 may prevent the organic material of the flexible substrate 20 from absorbing the laser, and thereby the structure of the material in the laser action region 201 is not thoroughly destroyed (as indicated by the dashed circle in FIG. 1(b)). As a result, when the flexible substrate 20 is separated from the hard substrate 10, the flexible substrate 20 is difficult to separate from the hard substrate 10 in a region occluded by the particle 30.

Embodiments of the present disclosure provide a laser lift-off method and a laser lift-off system, which make the material layer easier to separate from the substrate than the prior art.

Figure 3:
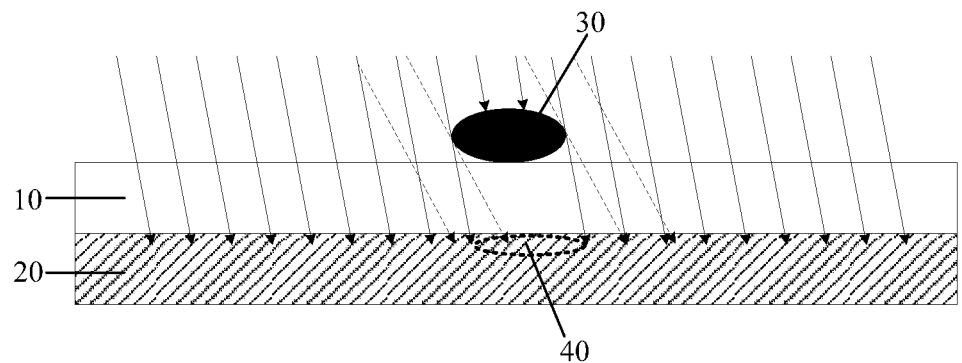
FIG. 3 is a first schematic structure diagram of laser lift-off according to embodiments of the present disclosure.

Embodiments of the present disclosure provide a laser lift-off method, and as shown in FIG. 2 and FIG. 3, the laser lift-off method includes the following steps.

In S100, a laser beam is controlled to penetrate the substrate 10 along a first irradiation direction (indicated by the solid arrow in FIG. 3), so as to scan an interface between the material layer 20 and the substrate 10 that are stacked on each other. There is at least one particle 30 on a side of the substrate 10 away from the material layer 20, and a region of the interface not irradiated by the laser beam along the first irradiation direction is an occluded region 40.

Figure 4:
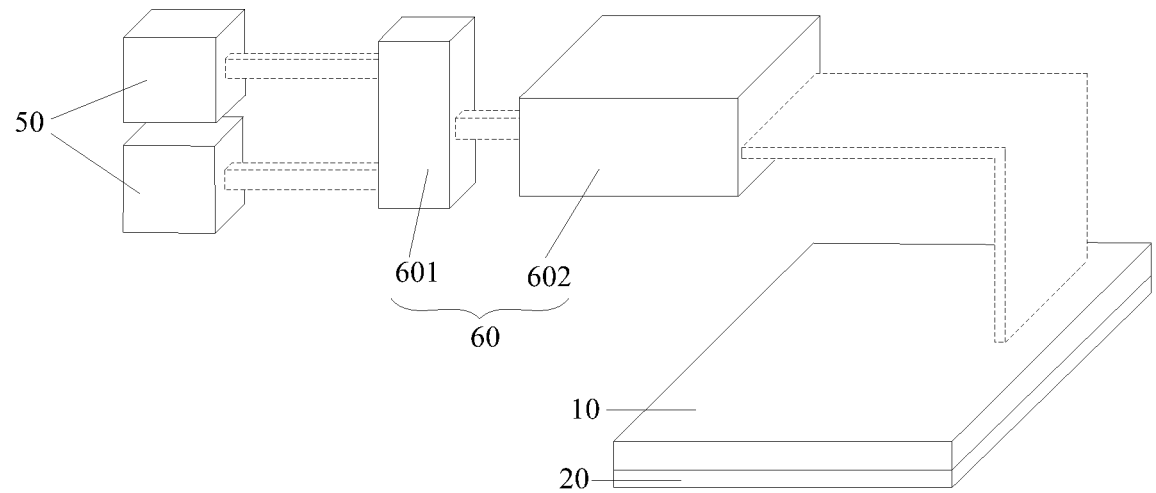
FIG. 4 is a second schematic structure diagram of laser lift-off according to embodiments of the present disclosure.

When the laser lift-off system is working, as shown in FIG. 4, one or more laser emitters 50 emit one or more laser beams, i.e., one or more laser spots (FIG. 4 takes two laser emitters as an example). The one or more laser beams are integrated and shaped by an optic processing device 60, and thus a linear laser beam is obtained. The linear laser beam scans the interface between the material layer 20 and the substrate 10 to separate the material layer 20 from the substrate 10. The optic processing device 60 here may include an integrating optic system 601 and a spot shaping optic system 602. The integrating optic system 601 is used for integrating one or more pulse laser spots emitted by the laser emitters 50 into one laser beam. The spot shaping optic system 602 is used for shaping the laser beam to obtain a linear laser beam with a required size. In embodiments of the present disclosure, the process in which the laser beam scans along the first irradiation direction will not be limited, and reference can be made to the process described in FIG. 1(a) above.

Here when the material layer 20 is formed directly on the substrate 10, the interface between the material layer 20 and the substrate 10 is a surface of the material layer 20 contacting with the substrate 10. In this case, the interface between the material layer 20 and the substrate 10 is scanned, then the structure of the surface of the material layer 20 contacting with the substrate 10 is destroyed, and thereby the material layer 20 is separated from the substrate 10. When the material layer 20 is formed on the substrate 10 via an optic transparent adhesive, the interface between the material layer 20 and the substrate 10 is an optic transparent adhesive layer. In this case, the interface between the material layer 20 and the substrate 10 is scanned, then the structure of the optic transparent adhesive is destroyed, and thereby the material layer 20 is separated from the substrate 10.

The first irradiation direction is a direction along which an angle between the laser beam and the substrate 10 is $\theta_1$. $\theta_1$ will not be limited, and it may be any angle greater than 0°, such as 10°, 20°, 30°, 40°, 50°, 60°, 70°, 80°, or 90°.

It will be noted that, when the laser beam scans along the first irradiation direction, owing to the existence of the at least one particle 30, the occluded region(s) 40 are not irradiated, so the structure(s) of the interface in the occluded region(s) 40 are not destroyed. Consequently, portion(s) of the material layer 20 in the occluded region(s) 40 are hard to separate from the substrate 10. The size(s) of the occluded region(s) 40 are related to the size of the at least one particle 30. The location of an occluded region 40 is related to the location of a corresponding one of the at least one particle 30 and the first irradiation direction.

In S101, a laser beam is controlled to penetrate the substrate 10 along a second irradiation direction (indicated by the dotted arrow in FIG. 3), so as to scan the interface between the material layer 20 and the substrate 10, so that at least a part of the occluded region 40 is irradiated by the laser beam along the second irradiation direction.

For the occluded region 40 not irradiated when the scanning is performed along the first irradiation direction, it may be entirely or partially irradiated by the scanning along the second irradiation direction, which is related to the angle of the second irradiation direction.

Figure 7:
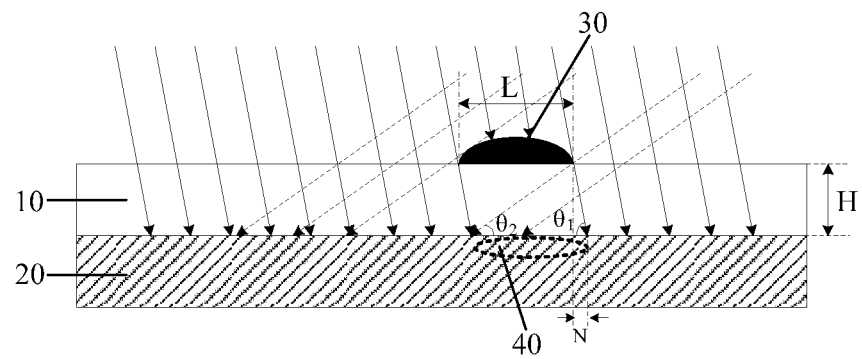
FIG. 7 is a fourth schematic structure diagram of laser lift-off according to embodiments of the present disclosure.

Those skilled in the art will understand that since the occluded region 40 not irradiated when the scanning is performed along the first irradiation direction may be at least partially irradiated by the scanning along the second irradiation direction, the first irradiation direction is different from the second irradiation direction. The difference may be a difference in the irradiation direction. For example, in some embodiments, the first irradiation direction and the second irradiation direction are on different sides of a plane perpendicular to the substrate 10. For example, as shown in FIG. 7, the first irradiation direction is on a left side of the plane perpendicular to the substrate 10, while the second irradiation direction is on a right side of the plane perpendicular to the substrate 10. The difference may also be a difference in the angle between the laser beam and the substrate 10. For example, the angle between the laser beam along the first irradiation direction and the substrate 10 is 90°, 85°, 80°, 75°, 70°, etc., and the angle between the laser beam along the second irradiation direction and the substrate 10 is 60°, 55°, 50°, 45°, 40°, etc.

Furthermore, when the laser beam scans along the second irradiation direction, it may scan the whole interface between the material layer 20 and the substrate 10, or merely scan the occluded region 40 not irradiated by the laser beam along the first irradiation direction. On this basis, a single laser source may be used for emitting a laser beam along the first irradiation direction and a laser beam along the second irradiation direction. Alternatively, different laser sources may be used for emitting a laser beam along the first irradiation direction and a laser beam along the second irradiation direction, respectively.

In S102, the material layer 20 is separated from the substrate 10.

The material layer 20 may be separated from the substrate 10 using a film fit-off device here. Alternatively, the material layer 20 may be separated from the substrate 10 manually, which will not be limited here.

The embodiments of the present disclosure provide the laser lift-off method. When laser beams are used for separating the material layer 20 from the substrate 10, since after a laser beam scans the interface between the material layer 20 and the substrate 10 along the first irradiation direction, a laser beam further scans the interface between the material layer 20 and the substrate 10 along the second irradiation direction, at least a part of the occluded region 40 not irradiated by the laser beam along the first irradiation direction may be irradiated by the laser beam along the second irradiation direction. In the prior art, the interface between the material layer and the substrate is merely irradiated along the first irradiation direction. By contrast, in the embodiments of the present disclosure, the irradiated area of the interface between the material layer 20 and the substrate 10 is increased. Therefore, compared with the prior art, the embodiments of the present disclosure are easier to separate the material layer 20 from the substrate 10, thus enhancing the yield rate of the products.

Figure 5:
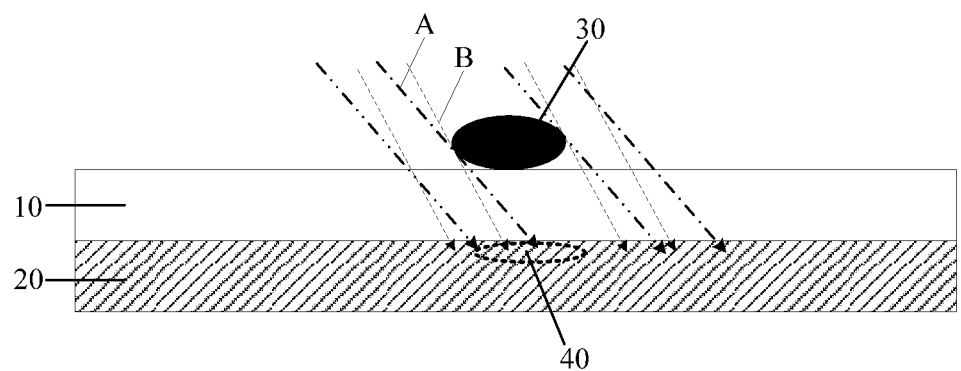
FIG. 5 is a schematic structure diagram when a laser beam irradiates along two kinds of second irradiation directions according to embodiments of the present disclosure.

Those skilled in the art will understand that the bigger the irradiated area of the interface between the material layer 20 and the substrate 10 is, the easier the material layer 20 is separated from the substrate 10. When the laser beam irradiates the interface between the material layer 20 and the substrate 10 along the first irradiation direction, the size of the occluded region 40 not irradiated is related to the size of a corresponding one of the at least one particle 30. When the laser beam irradiates along the second irradiation direction, the laser beam along the second irradiation direction and the substrate 10 have an angle therebetween. The magnitude of this angle and the relationship between the second irradiation direction and the first irradiation direction (the first irradiation direction and the second irradiation direction are on a same side or on different sides of the plane perpendicular to the substrate 10) may affect the size of part of the occluded region 40 irradiated by the laser beam along the second irradiation direction. From FIG. 5, it can be seen that the area of part of the occluded region 40 irradiated by the laser beam along direction A is greater than the area of part of the occluded region 40 irradiated by the laser beam along direction B.

On account of the above, to confirm that a maximum portion of the occluded region 40 is irradiated along the second irradiation direction, optionally, before the laser beam is controlled to penetrate the substrate 10 along the second irradiation direction, so as to scan the interface between the material layer 20 and the substrate 10, the above method further includes: detecting a size of the at least one particle 30, and determining the second irradiation direction according to the detected size of the at least one particle 30 and the first irradiation direction.

How to detect the size of the at least one particle 30 will not be limited. Devices in the prior art can be used to detect the size of the at least one particle 30. For example, an automatic optic inspection (AOI) device can be used to detect the size of the at least one particle 30.

In the embodiments of the present disclosure, the second irradiation direction is determined precisely according to the size of the at least one particle 30 and the first irradiation direction, and then the laser beam is controlled to irradiate along the second irradiation direction. This may maximize the area of part of the occluded region 40 irradiated by the laser beam along the second irradiation direction, thus facilitating the material layer 20 being separated from the substrate 10.

Figure 6:
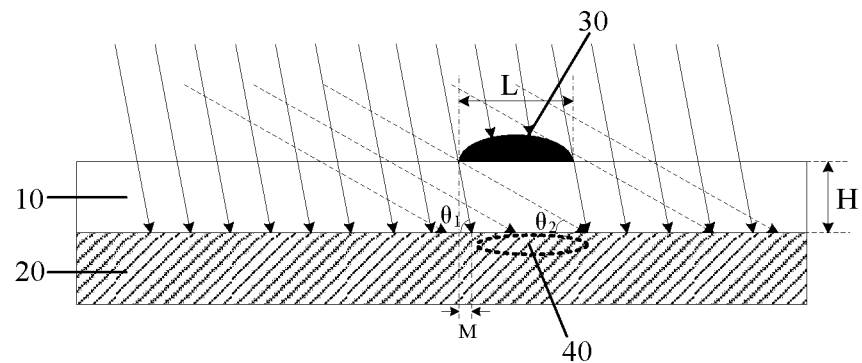
FIG. 6 is a third schematic structure diagram of laser lift-off according to embodiments of the present disclosure.

Optionally, as shown in FIG. 6, the first irradiation direction is a direction along which the angle between the laser beam and the substrate 10 is $\theta_1$, and the second irradiation direction is a direction along which the angle between the laser beam and the substrate 10 is $\theta_2$. The first irradiation direction and the second irradiation direction are on a same side of the plane perpendicular to the substrate 10. For example, as shown in FIG. 6, the first irradiation direction and the second irradiation direction are both on the left side of the plane perpendicular to the substrate 10. Then $\theta_2$ is:

$$\theta_2 = \arctan\left(\frac{H \cdot \tan\theta_1}{(H+L) \cdot \tan\theta_1}\right),$$

where L is a biggest size of the at least one particle 30, and H is a thickness of the substrate 10.

Here, since a thickness of the substrate 10 is usually about 0.5 mm, a thickness of the material layer 20 is usually about 10 μm, and a thickness of the material layer 20 subjected to an action of the laser beam (i.e., the laser action zone) is about 100 nm, a length of the at least one particle 30 along the thickness direction of the substrate 10 and a thickness of the material layer 20 subjected to the action of the laser beam can be ignored.

It will be noted that, a shape of the at least one particle 30 will not be limited, and it may be spherical, square or have other irregular shapes. L is a biggest size of the at least one particle 30, i.e., a biggest length of the at least one particle 30 along a direction parallel to the substrate 10.

Referring to FIG. 6, $$\tan\theta_1 = \frac{H}{M}, \text{ then } M = \frac{H}{\tan\theta_1};$$

$$\tan\theta_2 = \frac{H}{L+M}, \text{ then } \tan\theta_2 = \frac{H \cdot \tan\theta_1}{H + L \cdot \tan\theta_1}, \theta_2 = \arctan\left(\frac{H \cdot \tan\theta_1}{H + L \cdot \tan\theta_1}\right).$$

In the embodiments of the present disclosure, when the laser beam irradiates along the second irradiation direction, if the first irradiation direction and the second irradiation direction are on a same side of the plane perpendicular to the substrate 10, and along the second irradiation direction, $$\theta_2 = \arctan\left(\frac{H \cdot \tan\theta_1}{H + L \cdot \tan\theta_1}\right),$$

then all the occluded region 40 not irradiated by the laser beam along the first irradiation direction may be irradiated by the laser beam along the second irradiation direction. Thereby, the whole interface between the material layer 20 and the substrate 10 may be irradiated, which is beneficial to separate the material layer 20 from the substrate 10.

Furthermore, besides the direction along which the angle between the laser beam and the substrate 10 is $$\arctan\left(\frac{H \cdot \tan\theta_1}{H + L \cdot \tan\theta_1}\right),$$

the second irradiation direction may also be a direction along which the angle between the laser beam and the substrate 10 is less than $$\arctan\left(\frac{H \cdot \tan\theta_1}{H + L \cdot \tan\theta_1}\right).$$

In this case, the laser beam can also irradiate all the occluded region 40. That is, $\theta_2$ may be:

$$\theta_2 \leq \arctan\left(\frac{H \cdot \tan\theta_1}{H + L \cdot \tan\theta_1}\right).$$

Optionally, as shown in FIG. 7, the first irradiation direction is a direction along which the angle between the laser beam and the substrate 10 is $\theta_1$, and the second irradiation direction is a direction along which the angle between the laser beam and the substrate 10 is $\theta_2$. The first irradiation direction and the second irradiation direction are on different sides of the plane perpendicular to the substrate 10. For example, as shown in FIG. 7, the first irradiation direction is on the left side of the plane perpendicular to the substrate 10, while the second irradiation direction is on the right side of the plane perpendicular to the substrate 10. Then $\theta_2$ is:

$$\theta_2 = \arctan\left(\frac{H \cdot \tan\theta_1}{L \cdot \tan\theta_1 - H}\right),$$

where L is a biggest size of the at least one particle 30, and H is a thickness of the substrate 10.

Referring to FIG. 7, $$\tan\theta_1 = \frac{H}{N}, \text{ then } N = \frac{H}{\tan\theta_1}; \tan\theta_2 = \frac{H}{L-N}, \text{ then }$$

$$\tan\theta_2 = \frac{H \cdot \tan\theta_1}{L \cdot \tan\theta_1 - H}, \theta_2 = \arctan\left(\frac{H \cdot \tan\theta_1}{L \cdot \tan\theta_1 - H}\right).$$

In the embodiments of the present disclosure, when the laser beam irradiates along the second irradiation direction, if the first irradiation direction and the second irradiation direction are on different sides of the plane perpendicular to the substrate 10, and along the second irradiation direction, $$\theta_2 = \arctan\left(\frac{H \cdot \tan\theta_1}{L \cdot \tan\theta_1 - H}\right),$$

then all the occluded region 40 not irradiated by the laser beam along the first irradiation direction may be irradiated by the laser beam along the second irradiation direction.

Thereby, the whole interface between the material layer 20 and the substrate 10 may be irradiated, which is beneficial to separate the material layer 20 from the substrate 10.

Furthermore, besides the direction along which the angle between the laser beam and the substrate 10 is $$\arctan\left(\frac{H \cdot \tan\theta_1}{L \cdot \tan\theta_1 - H}\right),$$

the second irradiation direction may also be a direction along which the angle between the laser beam and the substrate 10 is less than $$\arctan\left(\frac{H \cdot \tan\theta_1}{L \cdot \tan\theta_1 - H}\right).$$

In this case, the laser beam may also irradiate all the occluded region 40. That is, $\theta_2$ may be:

$$\theta_2 \leq \arctan\left(\frac{H \cdot \tan\theta_1}{L \cdot \tan\theta_1 - H}\right).$$

When the laser beam irradiates along the second irradiation direction, it is likely that the laser beam does not irradiate all the occluded region 40 not irradiated by the laser beam along the first irradiation direction. On account of this, optionally, in embodiments of the present disclosure, before the material layer 20 is separated from the substrate 10, the above method further includes: controlling a laser beam to penetrate the substrate 10 along a third irradiation direction, so as to scan the interface between the material layer 20 and the substrate 10, so that a region of the interface not irradiated by the laser beam along the first irradiation direction and the laser beam along the second irradiation direction may be irradiated by the laser beam along the third irradiation direction.

The third irradiation direction will not be limited, as long as it can irradiate the region not irradiated by the laser beam along the first irradiation direction and the laser beam along the second irradiation direction. The third irradiation direction and the second irradiation direction may be on different sides of the plane perpendicular to the substrate 10, or on a same side of the plane perpendicular to the substrate 10.

The laser beam along the second irradiation direction and the laser beam along the third irradiation direction may irradiate at the same time or at different time.

In the embodiments of the present disclosure, besides the laser beam controlled to irradiate the occluded region 40 along the second irradiation direction, a laser beam is controlled to irradiate the interface between the material layer 20 and the substrate 10 along the third irradiation direction. Thereby, the irradiated area of the interface between the material layer 20 and the substrate 10 may be further increased, so as to reduce the area of part of the occluded region 40 not irradiated by the laser beam along the first irradiation direction, which is even beneficial to separate the material layer 20 from the substrate 10.

Figure 8:
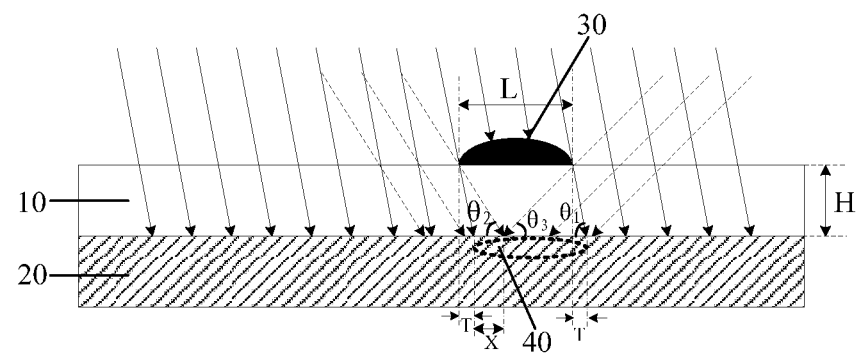
FIG. 8 is a fifth schematic structure diagram of laser lift-off according to embodiments of the present disclosure.

Further optionally, as shown in FIG. 8, the first irradiation direction is a direction along which the angle between the laser beam and the substrate 10 is $\theta_1$, the second irradiation direction is a direction along which the angle between the laser beam and the substrate 10 is $\theta_2$, and the third irradiation direction is a direction along which the angle between the laser beam and the substrate 10 is $\theta_3$. The first irradiation direction and the second irradiation direction are on a same side of the plane perpendicular to the substrate 10. The first irradiation direction and the third irradiation direction are on different sides of the plane perpendicular to the substrate 10. As shown in FIG. 8, the first irradiation direction and the second irradiation direction are on the left side of the plane perpendicular to the substrate 10, and the third irradiation direction is on the right side of the plane perpendicular to the substrate 10.

$\theta_2$ is:

$$\theta_2 = \arctan\left(\frac{H \cdot \tan\theta_1}{H + X \cdot \tan\theta_1}\right);$$

$\theta_3$ is:

$$\theta_3 = \arctan\left(\frac{H \cdot \tan\theta_1}{(L - X) \cdot \tan\theta_1 - H}\right),$$

where $0 < X < L$, L is a biggest size of the at least one particle 30, and H is a thickness of the substrate 10.

Referring to FIG. 8, $$\tan\theta_1 = \frac{H}{T}, \text{ then } T = \frac{H}{\tan\theta_1}; \tan\theta_2 = \frac{H}{T + X}, \text{ then}$$

$$\tan\theta_2 = \frac{H \cdot \tan\theta_1}{H + X \cdot \tan\theta_1}, \theta_2 = \arctan\left(\frac{H \cdot \tan\theta_1}{H + X \cdot \tan\theta_1}\right);$$

$$\tan\theta_3 = \frac{H}{L - X - T}, \text{ then } \tan\theta_3 = \frac{H \cdot \tan\theta_1}{(L - X) \cdot \tan\theta_1 - H},$$

$$\theta_3 = \arctan\left(\frac{H \cdot \tan\theta_1}{(L - X) \cdot \tan\theta_1 - H}\right).$$

When $X = L/2$, and $\theta_1 = 90°$ (i.e., the first irradiation direction is perpendicular to the substrate 10), $$\theta_2 = \theta_3 = \arctan\left(\frac{2H}{L}\right).$$

In the embodiments of the present disclosure, when the laser beams are controlled to respectively scan the interface between the material layer 20 and the substrate 10 along the first irradiation direction, the second irradiation direction and the third irradiation direction, and along the second irradiation direction, $$\theta_2 = \arctan\left(\frac{H \cdot \tan\theta_1}{H + X \cdot \tan\theta_1}\right),$$

and along the third irradiation direction, $$\theta_3 = \arctan\left(\frac{H \cdot \tan\theta_1}{(L - X) \cdot \tan\theta_1 - H}\right),$$

all the occluded region 40 not irradiated by the laser beam along the first irradiation direction may be irradiated, which is beneficial to separate the material layer 20 from the substrate 10.

When $$\theta_2 = \arctan\left(\frac{H \cdot \tan\theta_1}{H + X \cdot \tan\theta_1}\right),$$

$\theta_3$ may be less than $$\arctan\left(\frac{H \cdot \tan\theta_1}{(L-X) \cdot \tan\theta_1 - H}\right).$$

When $$\theta_3 = \arctan\left(\frac{H \cdot \tan\theta_1}{(L-X) \cdot \tan\theta_1 - H}\right),$$

$\theta_2$ may be less than $$\arctan\left(\frac{H \cdot \tan\theta_1}{H + X \cdot \tan\theta_1}\right).$$

Alternatively, $$\theta_2 < \arctan\left(\frac{H \cdot \tan\theta_1}{H + X \cdot \tan\theta_1}\right) \text{ and}$$

$$\theta_3 < \arctan\left(\frac{H \cdot \tan\theta_1}{(L-X) \cdot \tan\theta_1 - H}\right).$$

That is, for any X between 0 and L, $\theta_2$ and $\theta_3$ may respectively be:

$$\theta_2 \leq \arctan\left(\frac{H \cdot \tan\theta_1}{H + X \cdot \tan\theta_1}\right) \text{ and}$$

$$\theta_3 \leq \arctan\left(\frac{H \cdot \tan\theta_1}{(L-X) \cdot \tan\theta_1 - H}\right).$$

In this case, the occluded region 40 not irradiated by the laser beam along the first irradiation direction may also be entirely irradiated.

Those skilled in the art will know that when the material layer 20 and the substrate 10 are cleaned in the pre-cleaning stage of the laser lift-off technique, multiple particles 30 may remain on the side of the substrate 10 away from the material layer 20. If a size of each particle 30 is detected, and the second irradiation direction is adjusted according to the size of each particle 30, the process of laser lift-off may be very complex, rendering a long lift-off time and thus lowering the production efficiency. The bigger the size of the particle 30 is, the larger the occluded region 40 is when the laser beam irradiates along the first irradiation direction. If the occluded region 40 occluded by the biggest particle 30 at the time of irradiation along the first irradiation direction can be entirely irradiated along the second irradiation direction, the occluded regions 40 occluded by other particles 30 can also be irradiated entirely along the second irradiation direction.

On account of the above, optionally, in embodiments of the present disclosure, detecting the size of the at least one particle 30 and determining the second irradiation direction according to the detected size of the at least one particle 30 and the first irradiation direction, includes: in response to detecting multiple particles 30 on a side of the substrate 10 away from the material layer 20, determining a size of a biggest one of the multiple particles 30 according to detected sizes of the multiple particles 30; and determining the second irradiation direction according to the size of the biggest particle 30 and the first irradiation direction.

In the above step, if sizes of the multiple particles 30 are detected, these sizes are compared with each other to determine the size of the biggest one of the multiple particles 30.

In the embodiments of the present disclosure, since the biggest one of the multiple particles 30 forms an occluded region 40 with the largest area when it is scanned along the first irradiation direction, if the region occluded by the biggest one of the multiple particles 30 can be irradiated by the laser beam along the second irradiation direction, then the regions occluded by particles 30 of other sizes may also be irradiated by the laser beam along the second irradiation direction. Therefore, when the laser beam irradiates along the second irradiation direction determined according to the size of the biggest particle 30 and the first irradiation direction, the area of part of the occluded region 40 irradiated may be larger, which is beneficial to separate the material layer 20 from the substrate 10.

When the laser beam scans along the second irradiation direction, if the whole interface between the material layer 20 and the substrate 10 is scanned, the region not occluded in the irradiation along the first irradiation direction would be irradiated repeatedly. However, if the interface between the material layer 20 and the substrate 10 is irradiated by the laser beams repeatedly, the material layer 20 may be destroyed. On account of this, optionally, in embodiments of the present disclosure, before a laser beam is controlled to penetrate the substrate 10 along the second irradiation direction, so as to scan the interface between the material layer 20 and the substrate 10, the above method further includes: detecting a location of the at least one particle 30 on the substrate 10, and determining a location of the occluded region 40 according to the detected location of the at least one particle 30 on the substrate 10 and the first irradiation direction. In this case, controlling a laser beam to penetrate the substrate 10 along the second irradiation direction, so as to scan the interface between the material layer 20 and the substrate 10, includes: controlling the laser beam to penetrate the substrate 10 along the second irradiation direction to scan the occluded region 40.

How to detect the location of the at least one particle 30 on the substrate 10 will not be limited. Existing devices such as an automatic optic inspection (AOI) device can be used to detect the location of the at least one particle 30 on the substrate 10. Furthermore, a single device can be used to detect the size of the at least one particle 30 and the location thereof on the substrate 10 at the same time.

It will be noted that scanning the occluded region 40 means not scanning the whole interface between the material layer 20 and the substrate 10. When the occluded region 40 is scanned, the surrounding region of the occluded region 40 may also be scanned, which can be ignored here.

In the embodiments of the present disclosure, when the laser beam scans along the second irradiation direction, the laser beam is controlled to scan the occluded region 40, so that the region irradiated by the laser beam along the first irradiation direction is not irradiated again, and that the material layer 20 is not destroyed.

Figure 9:
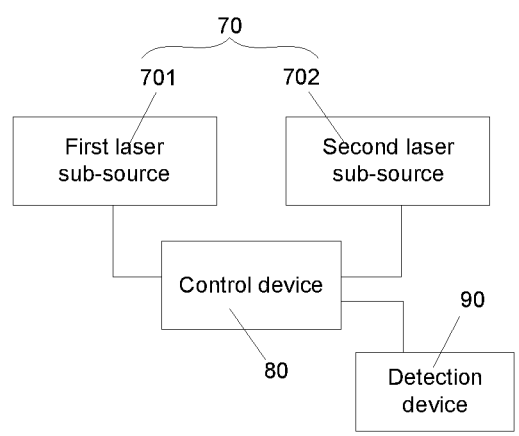
FIG. 9 is a schematic structure diagram of a laser lift-off system according to embodiments of the present disclosure.

Embodiments of the present disclosure provide a laser lift-off system, and as shown in FIG. 9, the system includes: a laser source 70 configured to emit laser beams; a control device 80 connected with the laser source 70 and configured to control one of the laser beams emitted by the laser source 70 to penetrate the substrate 10 along the first irradiation direction, so as to scan the interface between the material layer 20 and substrate 10 that are stacked on each other. There are particles 30 on a side of the substrate 10 away from the material layer 20, and a region of the interface not irradiated by the laser beam along the first irradiation direction is the occluded region 40. The control device 80 is further configured to control another one of the laser beams emitted by the laser source 70 to penetrate the substrate 10 along the second irradiation direction, so as to scan the interface between the material layer 20 and the substrate 10, so that at least a part of the occluded region 40 is irradiated by the another one of the laser beams along the second irradiation direction.

According to one or more embodiments, the control device 80 can be executed by a microprocessor programmed to perform one or more of the operations and/or functions described herein. According to one or more embodiments, the controller is implemented in whole or in part by specially configured hardware (for example, implemented by one or more application-specific integrated circuits (ASICs)).

Here a single laser source 70 may be controlled to emit a laser beam along the first irradiation direction and a laser beam along the second irradiation direction. Alternatively, as shown in FIG. 9, the laser source 70 includes a first laser sub-source 701 and a second laser sub-source 702, and the control device 80 controls a laser beam emitted by the first laser sub-source 701 to scan the interface between the material layer 20 and the substrate 10 along the first irradiation direction, and controls a laser beam emitted by the second laser sub-source 702 to scan the interface between the material layer 20 and the substrate 10 along the second irradiation direction.

On this basis, the first laser sub-source 701, as shown in FIG. 4, may include at least one laser emitter 50 and an optic processing device 60. The optic processing device 60 is used for integrating and shaping at least one laser beam emitted by the at least one laser emitter 50, so as to obtain a linear laser beam. The linear laser beam scans the interface between the material layer 20 and the substrate 10, so as to separate the material layer 20 from the substrate 10. The optic processing device 60 may include an integrating optic system 601 and a spot shaping optic system 602. The integrating optic system 601 is used for integrating multiple pulse laser spots emitted by multiple laser emitters 50 into one laser beam. The spot shaping optic system 602 is used for shaping the laser beam to obtain a linear laser beam with a required size. The second laser sub-source 702 includes at least one laser emitter 50, and at least one laser spot emitted by the at least one laser emitter 50 can be used for irradiating the region occluded by the at least one particle 30. If the region occluded by the at least one particle 30 is very small when the laser beam emitted by the first laser sub-source 701 irradiates along the first irradiation direction, optionally, the second laser sub-source 702 may include only one laser emitter 50.

The embodiments of the present disclosure provide the laser lift-off system. The control device 80 may control a laser beam emitted by the laser source 70 to scan the interface between the material layer 20 and the substrate 10 along the first irradiation direction, and then control another laser beam emitted by the laser source 70 to scan the interface between the material layer 20 and the substrate 10 along the second irradiation direction, so as to irradiate at least a part of the occluded region 40 not irradiated by the laser beam along the first irradiation direction. In the prior art, the interface between the material layer 20 and the substrate 10 is merely irradiated along the first irradiation direction. By contrast, in the embodiments of the present disclosure, the irradiated area of the interface between the material layer 20 and the substrate 10 is increased. Therefore, compared with the prior art, the embodiments of the present disclosure are easier to separate the material layer 20 from the substrate 10.

Optionally, as shown in FIG. 9, the laser lift-off system further includes a detection device 90 and the detection device 90 is configured to detect the location and/or the size of the at least one particle 30.

Type of the detection device will not be limited. For example, the detection device 90 may be an optic inspection device such as an automatic optic inspection (AOI) device or a pattern inspection machine. Furthermore, a charge-coupled device (CCD) may be provided on the automatic optic inspection (AOI) device or the pattern inspection machine.

After a laser beam emitted by the laser source 70 scans the whole interface between the material layer 20 and the substrate 10 along the first irradiation direction, if another laser beam emitted by the laser source 70 also scans the whole interface between the material layer 20 and the substrate 10 along the second irradiation direction, so that at least a part of the occluded region 40 occluded by the at least one particle 30 when the laser beam irradiates along the first irradiation direction can be irradiated by the laser beam along the second irradiation direction, the region not occluded by the at least one particle 30 when the laser beam irradiates along the first irradiation direction will be irradiated repeatedly. Moreover, if the laser beams scan the interface between the material layer 20 and the substrate 10 repeatedly, the material layer 20 may be destroyed. Therefore, the laser lift-off system further includes a detection device for detecting the location of the at least one particle 30. Thus, when irradiating along the second irradiation direction, the laser beam may just irradiate the occluded region 40 not irradiated by the laser beam along the first irradiation direction, so as to prevent the material layer 20 from being destroyed.

Furthermore, when the laser beam scans the interface between the material layer 20 and the substrate 10 along the second irradiation direction, since the detection device may be used to detect the size of the at least one particle 30, the second irradiation direction may be determined precisely according to the size of the at least one particle 30 and the first irradiation direction, so that a maximum portion of the occluded region 40 (the region not irradiated by the laser beam along the first irradiation direction) may be irradiated by the laser beam along the second irradiation direction, which is beneficial to separate the material layer 20 from the substrate 10.

The above embodiments are merely some specific embodiments of the present disclosure, but the protection scope of the present disclosure is not limited thereto. Any person skilled in the art could readily conceive of changes or replacement within the technical scope of the present disclosure, which shall all be included in the protection scope of the present disclosure. Therefore, the protection scope of the present disclosure shall be determined by the protection scope of the claims.

Additional embodiments may be provided in the present disclosure. These additional embodiments may include any of the above-mentioned embodiments, and one or more of components, functions or structures in the additional embodiments may be replaced or supplemented by one or more of components, functions or structures in any different one of the above-mentioned embodiments.

What is claimed is:

1. A laser lift-off method, comprising:
controlling a laser beam to penetrate a substrate along a first irradiation direction, so as to scan an interface between a material layer and the substrate stacked on each other, wherein there is at least one particle on a side of the substrate away from the material layer, and a region of the interface not irradiated by the laser beam along the first irradiation direction is an occluded region;
controlling another laser beam to penetrate the substrate along a second irradiation direction, so as to scan the interface between the material layer and the substrate, so that at least a part of the occluded region is irradiated by the another laser beam along the second irradiation direction; and
separating the material layer from the substrate; wherein before controlling the another laser beam to penetrate the substrate along the second irradiation direction, so as to scan the interface between the material layer and the substrate, the method further comprises:
detecting a size of the at least one particle, and determining the second irradiation direction according to the detected size of the at least one particle and the first irradiation direction.

2. The laser lift-off method according to claim 1, wherein, the first irradiation direction is a direction along which an angle between the laser beam and the substrate is $\theta_1$, the second irradiation direction is a direction along which an angle between the another laser beam and the substrate is $\theta_2$, and the first irradiation direction and the second irradiation direction are on a same side of a plane perpendicular to the substrate;
$\theta_2$ is $$\theta_2 = \arctan\left(\frac{H \cdot \tan\theta_1}{H + L \cdot \tan\theta_1}\right),$$

where L is a biggest size of the at least one particle, and H is a thickness of the substrate.

3. The laser lift-off method according to claim 1, wherein, the first irradiation direction is a direction along which an angle between the laser beam and the substrate is $\theta_1$, the second irradiation direction is a direction along which an angle between the another laser beam and the substrate is $\theta_2$, and the first irradiation direction and the second irradiation direction are on different sides of a plane perpendicular to the substrate;
$\theta_2$ is $$\theta_2 = \arctan\left(\frac{H \cdot \tan\theta_1}{L \cdot \tan\theta_1 - H}\right),$$

where L is a biggest size of the at least one particle, and H is a thickness of the substrate.

4. The laser lift-off method according to claim 1, wherein, before separating the material layer from the substrate, the method further comprises:
controlling a yet another laser beam to penetrate the substrate along a third irradiation direction, so as to scan the interface between the material layer and the substrate, so that a region of the interface not irradiated by the laser beam along the first irradiation direction and the another laser beam along the second irradiation direction is irradiated by the yet another laser beam along the third irradiation direction.

5. The laser lift-off method according to claim 4, wherein, the first radiation direction is a direction along which an angle between the laser beam and the substrate is $\theta_1$, the second radiation direction is a direction along which an angle between the another laser beam and the substrate is $\theta_2$, the third radiation direction is a direction along which an angle between the yet another laser beam and the substrate is $\theta_3$, the first radiation direction and the second radiation direction are on a same side of a plane perpendicular to the substrate, and the first radiation direction and the third radiation direction are on different sides of the plane perpendicular to the substrate;
$\theta_2$ is:

$$\theta_2 = \arctan\left(\frac{H \cdot \tan\theta_1}{H + X \cdot \tan\theta_1}\right);$$

$\theta_3$ is:

$$\theta_3 = \arctan\left(\frac{H \cdot \tan\theta_1}{(L - X) \cdot \tan\theta_1 - H}\right);$$

where 0<X<L, L is a biggest size of the at least one particle, and H is a thickness of the substrate.

6. The laser lift-off method according to claim 1, wherein, detecting a size of the at least one particle and determining the second irradiation direction according to the detected size of the at least one particle and the first irradiation direction, comprises:
in response to detecting multiple particles on a side of the substrate away from the material layer, determining a size of a biggest particle in the multiple particles according to sizes of the multiple particles; and
determining the second irradiation direction according to the size of the biggest particle and the first irradiation direction.

7. The laser lift-off method according to claim 1, wherein, before controlling the another laser beam to penetrate the substrate along the second irradiation direction, so as to scan the interface between the material layer and the substrate, the method further comprises:
detecting a location of the at least one particle on the substrate, and determining a location of the occluded region according to the detected location of the at least one particle on the substrate and the first irradiation direction; and
controlling the another laser beam to penetrate the substrate along the second irradiation direction, so as to scan the interface between the material layer and the substrate, comprises: controlling the another laser beam to penetrate the substrate along the second irradiation direction to scan the occluded region.

8. A laser lift-off system, comprising:
a laser source configured to emit laser beams;
a detection device configured to detect a size of at least one particle; and
a control device connected with the laser source and configured to control one of the laser beams emitted by the laser source to penetrate a substrate along a first irradiation direction, so as to scan an interface between a material layer and the substrate stacked on each other, wherein there is the at least one particle on a side of the substrate away from the material layer, and a region of the interface not irradiated by the one of the laser beams along the first irradiation direction is an occluded region; the control device is further configured to determine a second irradiation direction according to the detected size of the at least one particle and the first irradiation direction and control another one of the laser beams emitted by the laser source to penetrate the substrate along the second irradiation direction, so as to scan the interface between the material layer and the substrate, so that at least a part of the occluded region is irradiated by the another one of the laser beams along the second irradiation direction.

9. The laser lift-off system according to claim 8, wherein, the detection device further configured to detect a location of the at least one particle.

10. The laser lift-off system according to claim 9, wherein, the detection device is an automatic optic inspection device.

11. A method for manufacturing a display panel using the laser lift-off method according to claim 1, the method comprising:
   forming a hard substrate on a flexible substrate;
   controlling a laser beam to penetrate the hard substrate along a first irradiation direction, so as to scan an interface between the flexible substrate and the hard substrate stacked on each other, wherein there is at least one particle on a side of the hard substrate away from the flexible substrate, and a region of the interface not irradiated by the laser beam along the first irradiation direction is an occluded region;
   controlling another laser beam to penetrate the hard substrate along a second irradiation direction, so as to scan the interface between the flexible substrate and the hard substrate, so that at least a part of the occluded region is irradiated by the another laser beam along the second irradiation direction; and
   separating the flexible substrate from the hard substrate;
   wherein
   before controlling the another laser beam to penetrate the hard substrate along the second irradiation direction, so as to scan the interface between the flexible substrate and the hard substrate, the method further comprises:
   detecting a size of the at least one particle, and determining the second irradiation direction according to the detected size of the at least one particle and the first irradiation direction.

12. The method for manufacturing the display panel according to claim 11, wherein, the first irradiation direction is a direction along which an angle between the laser beam and the hard substrate is $\theta_1$, the second irradiation direction is a direction along which an angle between the another laser beam and the hard substrate is $\theta_2$, and the first irradiation direction and the second irradiation direction are on a same side of a plane perpendicular to the hard substrate;
$\theta_2$ is $$\theta_2 = \arctan\left(\frac{H \cdot \tan\theta_1}{H + L \cdot \tan\theta_1}\right),$$

where L is a biggest size of the at least one particle, and H is a thickness of the hard substrate.

13. The method for manufacturing the display panel according to claim 11, wherein, the first irradiation direction is a direction along which an angle between the laser beam and the hard substrate is $\theta_1$, the second irradiation direction is a direction along which an angle between the another laser beam and the hard substrate is $\theta_2$, and the first irradiation direction and the second irradiation direction are on different sides of a plane perpendicular to the hard substrate;
$\theta_2$ is $$\theta_2 = \arctan\left(\frac{H \cdot \tan\theta_1}{L \cdot \tan\theta_1 - H}\right),$$

where L is a biggest size of the at least one particle, and H is a thickness of the hard substrate.

14. The method for manufacturing the display panel according to claim 11, wherein, before separating the flexible substrate from the hard substrate, the method further comprises:
   controlling a yet another laser beam to penetrate the hard substrate along a third irradiation direction, so as to scan the interface between the flexible substrate and the hard substrate, so that a region of the interface not irradiated by the laser beam along the first irradiation direction and the another laser beam along the second irradiation direction is irradiated by the yet another laser beam along the third irradiation direction.

15. The method for manufacturing the display panel according to claim 14, wherein, the first radiation direction is a direction along which an angle between the laser beam and the hard substrate is $\theta_1$, the second radiation direction is a direction along which an angle between the another laser beam and the hard substrate is $\theta_2$, the third radiation direction is a direction along which an angle between the yet another laser beam and the hard substrate is $\theta_3$, the first radiation direction and the second radiation direction are on a same side of a plane perpendicular to the hard substrate, and the first radiation direction and the third radiation direction are on different sides of the plane perpendicular to the hard substrate;
$\theta_2$ is:

$$\theta_2 = \arctan\left(\frac{H \cdot \tan\theta_1}{H + X \cdot \tan\theta_1}\right);$$

$\theta_3$ is:

$$\theta_3 = \arctan\left(\frac{H \cdot \tan\theta_1}{(L - X) \cdot \tan\theta_1 - H}\right);$$

where 0<X<L, L is a biggest size of the at least one particle, and H is a thickness of the hard substrate.

16. The method for manufacturing the display panel according to claim 11, wherein, detecting a size of the at least one particle and determining the second irradiation direction according to the detected size of the at least one particle and the first irradiation direction, comprises:
   in response to detecting multiple particles on a side of the hard substrate away from the flexible substrate, determining a size of a biggest particle in the multiple particles according to sizes of the multiple particles; and determining the second irradiation direction according to the size of the biggest particle and the first irradiation direction.

17. The method for manufacturing the display panel according to claim 11, wherein, before controlling the another laser beam to penetrate the hard substrate along the second irradiation direction, so as to scan the interface between the flexible substrate and the hard substrate, the method further comprises:
- detecting a location of the at least one particle on the hard substrate, and determining a location of the occluded region according to the detected location of the at least one particle on the hard substrate and the first irradiation direction; and
- controlling the another laser beam to penetrate the hard substrate along the second irradiation direction, so as to scan the interface between the flexible substrate and the hard substrate, comprises: controlling the another laser beam to penetrate the hard substrate along the second irradiation direction to scan the occluded region.

* * * * *